United States Patent
Rathi et al.

(10) Patent No.: US 10,302,727 B2
(45) Date of Patent: May 28, 2019

(54) SYSTEM AND METHOD FOR HIGH RESOLUTION DIFFUSION IMAGING

(71) Applicant: The General Hospital Corporation, Boston, MA (US)

(72) Inventors: Yogesh Rathi, Lexington, MA (US); Lipeng Ning, Lexington, MA (US); Oleg Michailovich, Ontario (CA); Kawin Setsompop, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 801 days.

(21) Appl. No.: 14/940,202

(22) Filed: Nov. 13, 2015

(65) Prior Publication Data

US 2017/0003368 A1 Jan. 5, 2017

Related U.S. Application Data

(60) Provisional application No. 62/188,135, filed on Jul. 2, 2015.

(51) Int. Cl.
*G01R 33/563* (2006.01)
*G01R 33/56* (2006.01)

(52) U.S. Cl.
CPC ... *G01R 33/56341* (2013.01); *G01R 33/5608* (2013.01)

(58) Field of Classification Search
CPC .................. G01R 33/56341; G01R 33/5608
USPC ..................................................... 324/309
See application file for complete search history.

(56) References Cited

U.S. PATENT DOCUMENTS 6,265,874 B1 * 7/2001 McGee ............ G01R 33/56509
324/306
7,595,639 B2 * 9/2009 Bayram ............ G01R 33/4818
324/300

\* cited by examiner

*Primary Examiner* — Reena Aurora
(74) *Attorney, Agent, or Firm* — Quarles & Brady LLP

(57) ABSTRACT

A system and method for producing high resolution diffusion information and imaging from a subject. In some aspects, the method includes receiving a plurality of low resolution diffusion images, each acquired with a different set of gradient directions and shifted in a slice direction, and generating a model correlating diffusion signals associated with the plurality of low resolution diffusion images and a high resolution diffusion image. The method also includes reconstructing the high resolution diffusion image by minimizing a cost function determined using the model. In some applications, the method further includes processing the high resolution diffusion image to generate a report providing diffusion information associated with the subject.

25 Claims, 11 Drawing Sheets

(a) CC tracts  (b) CST tracts (a) GS Glyph  (b) LR Glyph  (c) CS-SRR Glyph (a) CB  (b) CST
(c) SLF-II  (d) CC-CMF

SYSTEM AND METHOD FOR HIGH RESOLUTION DIFFUSION IMAGING

CROSS-REFERENCE TO RELATED APPLICATIONS

This application is based on, claims the benefit of, and incorporates herein by reference in its entirety, U.S. Provisional Patent Application Ser. No. 62/188,135 filed on Jul. 2, 2015, and entitled "HIGH RESOLUTION DIFFUSION IMAGING."

STATEMENT REGARDING FEDERALLY SPONSORED RESEARCH

This invention was made with government support under R01MH099797 and R00EB012107 awarded by the National Institutes of Health. The government has certain rights in the invention.

BACKGROUND

The present disclosure relates to systems and methods for magnetic resonance imaging ("MRI"). More specifically, the disclosure relates high resolution imaging.

Any nucleus that possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant γ of the nucleus). Nuclei which exhibit this phenomena are referred to herein as "spins."

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_Z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_Z$, may be rotated, or "tipped", into the x-y plane to produce a net transverse magnetic moment $M_t$, which is rotating, or spinning, in the x-y plane at the Larmor frequency. The practical value of this phenomenon resides on signals which are emitted by the excited spins after the pulsed excitation signal $B_1$ is terminated. Depending upon of biologically variable parameters such as proton density, longitudinal relaxation time ("$T_1$") describing the recovery of $M_Z$ along the polarizing field, and transverse relaxation time ("$T_2$") describing the decay of $M_t$ in the x-y plane, this nuclear magnetic resonance ("NMR") phenomena is exploited to obtain image contrast using different measurement sequences and by changing imaging parameters.

When utilizing NMR to produce images, a technique is employed to obtain NMR signals from specific locations in the subject. Typically, the region to be imaged (region of interest) is scanned using a sequence of NMR measurement cycles that vary according to the particular localization method being used. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified. The acquisition of the NMR signals samples is referred to as sampling k-space, and a scan is completed when enough NMR cycles are performed to fully sample k-space. The resulting set of received NMR signals are digitized and processed to reconstruct the image using various reconstruction techniques.

Diffusion-weighted imaging ("DWI") is an important MRI technique that is based on the measurement of random motion of water molecules in tissues. DWI has been utilized for studying the anatomy of the brain, such as neural architecture and brain connectivity, as well as various brain disorders, including Alzheimer's disease, schizophrenia, mild traumatic brain injury, and so forth. For many clinical applications, such as neurosurgical planning and deep brain stimulation, diffusion images with high spatial resolution are critical for accurately characterizing brain structures. In particular, high resolution is desirable for identifying structures that are very small, such as the substantia nigra and sub-thalamic nucleus, or brain matter structures in neonate and infant brains. In addition, high resolution is advantageous for tracing small white-matter fiber bundles and reducing partial volume effects. However, common voxel sizes of standard diffusion magnetic resonance imaging ("dMRI") are generally about $2^3$ mm$^3$, which is too large for characterizing brain structures that are a few millimeters thick. Although reductions in voxel size may be possible by modifying acquisition, this would lead to proportionate decreases in the signal-to-noise ratio ("SNR") due to signal loss from $T_2$ decay, as well as distortions from magnetic field inhomogeneities. In addition, offsetting SNR losses by averaging multiple acquisitions would result acquisition times that would be too long to be practical in a clinical setting. For example, reducing voxel size from 2×2×2 mm$^3$ requires 64 averages to obtain an equivalent SNR.

Existing techniques attempting to obtain high-resolution ("HR") imaging can be classified into two categories based on their data acquisition scheme. In the first category, HR data is obtained from a single low-resolution ("LR") image using intelligent interpolations or regularization techniques. In particular, this technique has been applied to natural images, and more recently structural and diffusion MRI. Although successful in preserving and enhancing certain anatomical details, performance of this approach is limited by the information and resolution of the original LR image. In the second category, multiple LR images acquired according to a specific sampling scheme are used to reconstruct a HR image. Each LR image is modeled as the measurement of an underlying HR image via a down-sampling operator such that the observation model relates the original HR image to the observed LR images. Using concepts of super-resolution reconstruction ("SRR"), the HR image is then estimated by solving a linear inverse problem. This approach applied to dMRI typically reconstructs each diffusion-weighted volume of interest independently.

In another approach, an acquisition scheme where the LR images included orthogonal slice acquisition directions was also utilized. However, the distortions from LR scans with different slice directions requires corrections involving a complex non-linear spatial normalization process prior to the application of the SRR algorithm. In addition, each DWI volume was reconstructed independently, requiring the LR images to be acquired or interpolated on the same dense set of gradient directions. Moreover, this method required the same number of measurements (e.g., 60 gradient directions) for each LR acquisition. To address this problem, one recent approach utilizing the diffusion tensor imaging ("DTI") technique was introduced to model the diffusion signal in q-space. However, a very simplistic diffusion tensor model was assumed, which is often not appropriate for modeling more complex diffusion phenomena, such as white matter fiber crossings.

In light of the above, there is a continued need for improved imaging systems and methods, and in particular for systems and methods capable of high resolution imaging.

SUMMARY

The present disclosure provides systems and methods that overcome the aforementioned drawbacks by providing an innovative framework for reconstructing high spatial resolution imaging, such as diffusion magnetic resonance imaging ("dMRI"), using multiple lower resolution images acquired from a subject. In particular, shifted and downsampled low resolution images acquired using different diffusion directions may be used to construct a high resolution image using a an appropriate representation scheme. The high resolution image may then be obtained from the solution of an optimization problem that enforces sparsity and spatial consistency. As apparent from descriptions herein, high resolution images produced in accordance with the present disclosure have a wide variety of applications both in clinical and research settings. For instance, the present imaging approach not only allows discernment and characterization of much smaller anatomical tissues and tissue boundaries, but also facilitate more accurate modeling of complex structures, such as brain white matter fiber orientations, in a manner not previously achievable.

In accordance with one aspect of the disclosure, a method for producing high resolution diffusion imaging. The method includes receiving a plurality of low resolution diffusion images, each acquired with a different set of gradient directions and shifted in a slice direction, and generating a model correlating diffusion signals associated with the plurality of low resolution diffusion images and a high resolution diffusion image. The method also includes reconstructing the high resolution diffusion image by minimizing a cost function determined using the model. In some aspects, the method further includes analyzing the high resolution diffusion image to generate a report providing diffusion information associated with the subject.

In accordance with one aspect of the disclosure, a system for producing high resolution diffusion information from a subject is provided. The system includes an input configured to receive imaging data obtained from a subject using a magnetic resonance imaging ("MRI") system, and at least one processor configured to receive from the input a plurality of low resolution diffusion images each acquired with a different set of gradient directions and shifted in a slice direction, and generate a model correlating diffusion signals associated with the plurality of low resolution diffusion images and a high resolution diffusion image. The processor is also configured to reconstruct the high resolution diffusion image by minimizing a cost function determined using the model, and process the high resolution diffusion image to generate a report providing diffusion information from the subject. The system also includes an output for displaying the report.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
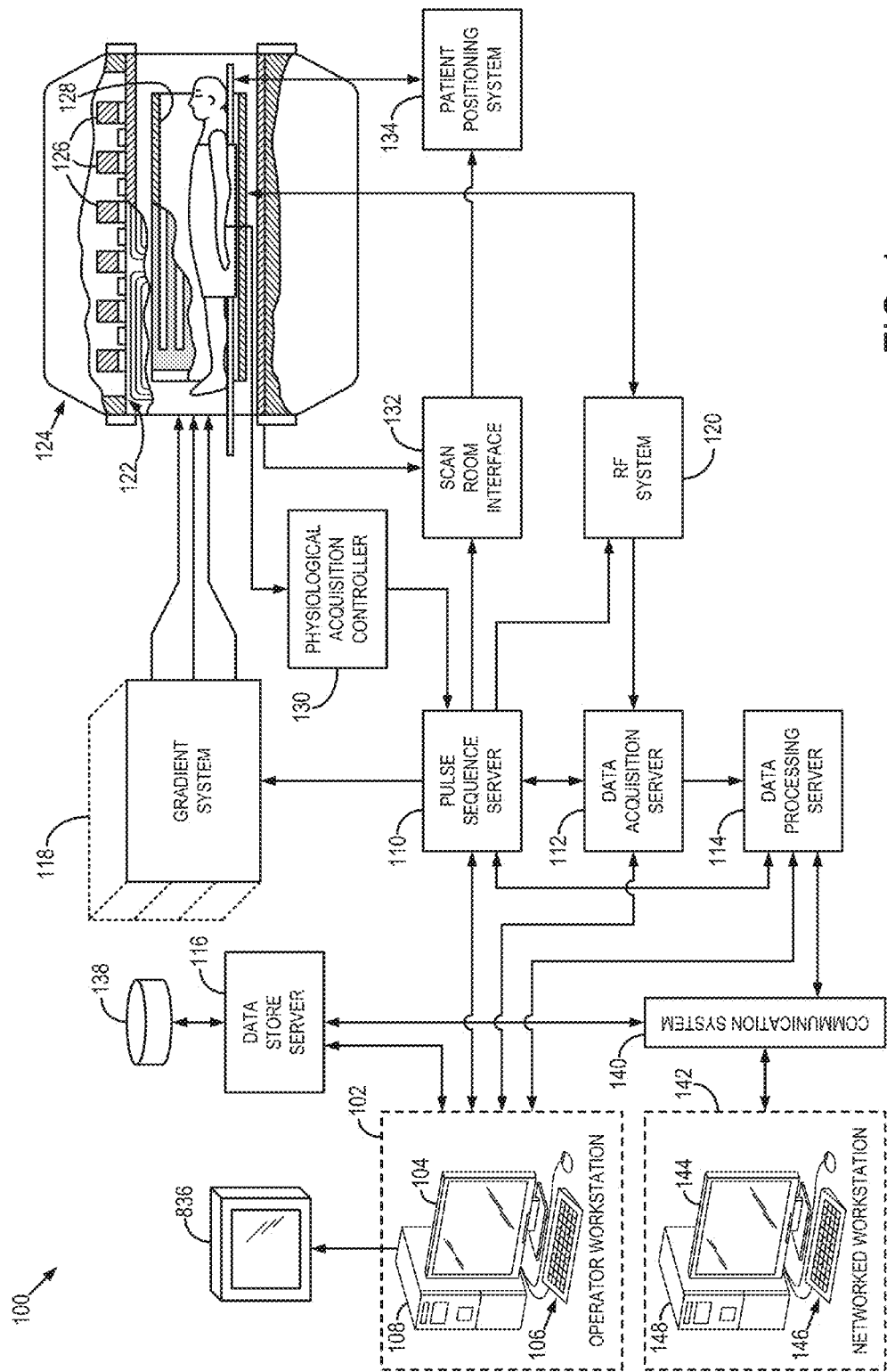
FIG. 1 is a schematic of a magnetic resonance imaging ("MRI") for use in accordance with aspects of the present disclosure.

Diffusion magnetic resonance imaging ("dMRI"), among other imaging techniques, can provide invaluable information about the structure and function of various tissues in the brain and other parts of a subject's anatomy. For instance, dMRI is often utilized in the analysis of tissue connectivity tracing pathways of white matter fibers in the brain. However, smaller fiber bundles connecting very small or subcortical regions cannot be traced or identified using standard dMRI techniques, which are restricted to large voxel sizes. On the other hand, imaging approaches attempting to reduce voxel size necessitate much longer acquisitions or produce images with reduced signal-to-noise ratio ("SNR"), thus limiting their applicability in clinical settings.

Therefore, the present disclosure is directed to a system and method for producing high resolution imaging, and more particularly to high resolution diffusion imaging. Specifically, the present disclosure introduces a novel acquisition and reconstruction scheme implementing concepts of compressed sensing and super spatial resolution into a complementary and focused process, termed compressed sensing super resolution reconstruction ("CS-SRR"), to produce high resolution diffusion imaging with reduced acquisition time and enhanced SNR.

As will be described, the present approach can utilize multiple low resolution ("LR") thick-slice dMRI volumes, which are under-sampled in q-space using a different set of gradients. In some aspects, the provided scheme implements a model correlating signals in the acquired LR images with those of a high resolution ("HR") image, represented in a sparsifying basis of spherical ridgelets. Using a total-variation ("TV") regularization to account for signal correlation in neighboring voxels, a computationally efficient algorithm based on the alternating direction method of multipliers ("ADMM") is introduced for solving the CS-SRR problem. The performance of the provided approach is quantitatively evaluated on several in-vivo human data sets, demonstrating that sub-millimeter super resolution dMRI may be achieved in clinically feasible acquisition time and with very good data fidelity. It may be noted that regularization using total-variation is not central to the present approach, and so any other regularizations, such as generalized total variation, can also be used.

The provided system and method may be implemented in a wide range of applications, and particularly applications requiring high resolution imaging beyond the capabilities of standard techniques. In this manner, normal and non-normal anatomical tissues of smaller dimensions may be resolved, thus facilitating diagnosis and treatment. In one example, the present approach may be utilized to more accurately characterize lesions or tumors along with their respective boundaries or invasiveness, thus reducing treatment margins and limiting complications. In another example, the present approach may be utilized in the analysis of brain connectivity, or tractography, providing highly improved information associated with white matter tissue pathways, and in particular resolving crossings of multiple fiber bundles. In yet another example, the present approach may be advantageous for various neurosurgical applications, providing detailed information for determining the optimal placement of brain stimulation electrodes in the treatment of Parkinson's' disease, obsessive compulsive disorder ("OCD"), or other neuro-psychiatric disorder or disease.

In addition, in some aspects, the approach of the present disclosure may be applied to estimate blood flow and blood volume. For instance, using very high resolution diffusion MRI images obtained from low resolution imaging acquired at low b-values, blood flow and blood volume may be estimated non-invasively where radioactive tracers cannot be used. This approach may be advantageous not only for the measuring blood perfusion in the brain, but also in other tissues or organs, such as the liver, kidney, pancreas, breast, and others. These, and other applications, may be readily appreciated from descriptions below.

Referring particularly now to FIG. 1, an example of a magnetic resonance imaging ("MRI") system 100 is illustrated. The MRI system 100 includes an operator workstation 102, which will typically include a display 104; one or more input devices 106, such as a keyboard and mouse; and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil (not shown in FIG. 1), are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays (not shown in FIG. 1).

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic. In some implementations, the data processing server 114, independently or in cooperation with the networked workstations 142, may be configured to carry out steps for reconstructing high resolution imaging, and more particularly for reconstructing high resolution diffusion imaging, using low resolution imaging data, in accordance with the present disclosure.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

Figure 2:
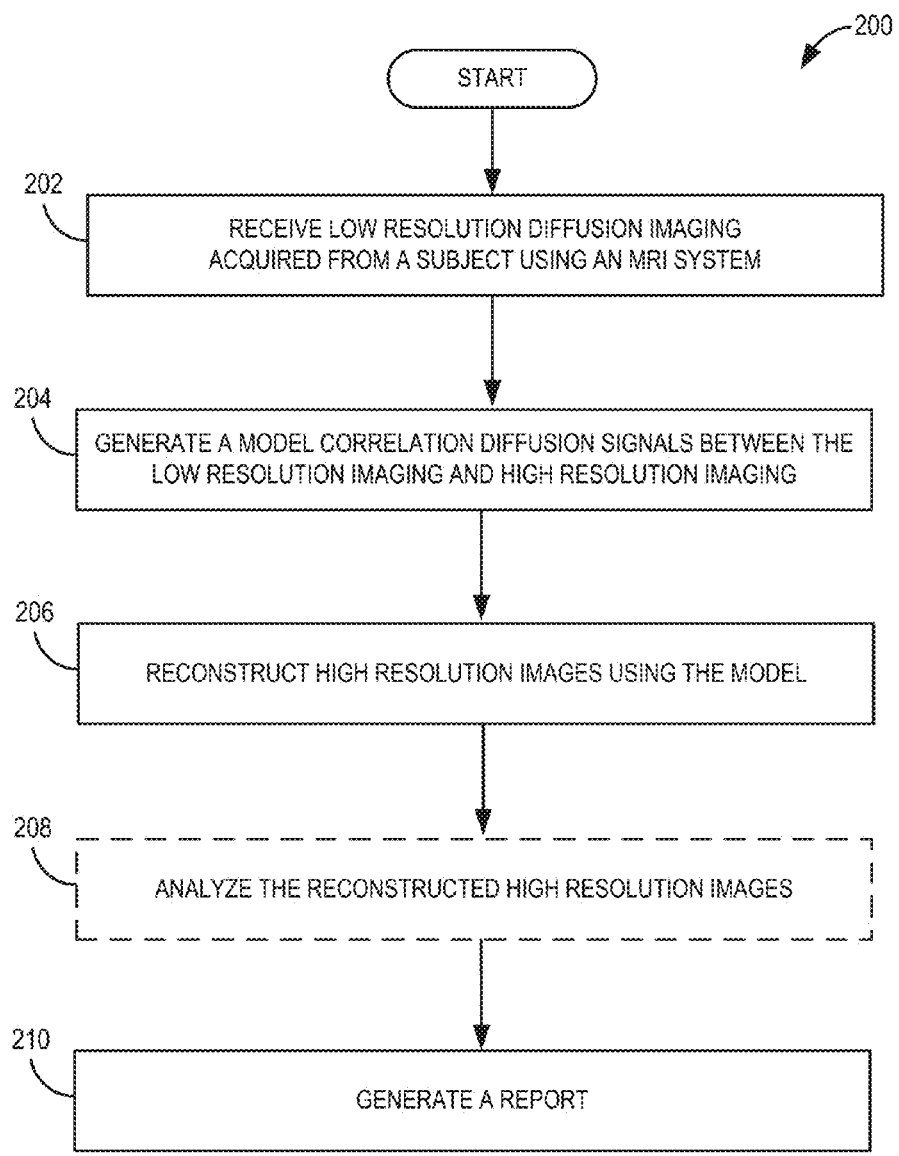
FIG. 2 is a flowchart setting forth steps of a process, in accordance with aspects of the present disclosure.

Turning to FIG. 2, steps of a process 200 for producing high resolution imaging are shown. In some implementations, the process 200 may be carried out using one or more computing system, device or processor, including a personal computer, laptop, workstation, and the like. The process 200 may begin at process block 202 with receiving imaging data or images acquired from a subject. Example imaging data or images include diffusion, $T_1$ and $T_2$-weighted and other imaging data or images. The imaging data or images may be retrieved from an imaging system as described with reference to FIG. 1, a server, or other data storage location via an input. Alternatively or additionally, imaging data may be acquired at process block 202 using the imaging system. For example, an echo planar imaging sequence may be carried out in a single shot or multiple shots to acquire the low resolution diffusion imaging data. In some aspects, various processing steps may be carried out at process block 202, including image reconstruction using raw imaging data, as well as steps to reduce various artifacts and noise.

In accordance with aspects of the present disclosure, low resolution diffusion images received and/or reconstructed at process block 202 are each acquired with a different or unique set of gradient directions. In particular, each low resolution diffusion image samples a different portion of q-space, for example, over a spherical shell in q-space, in accordance with the High Angular Resolution Diffusion Imaging ("HARDI") protocols. The images are also shifted relative to one another by sub-pixel dimensions, on the order of 1 to 2 millimeters, or less, for example, and overlap in the slice direction. In addition, the low resolution diffusion images may also include anisotropic voxel sizes.

In some implementations, the low resolution diffusion images received and/or reconstructed at process block 202 may have very low diffusion weighting, that is, low b-values. For example, b-values may be less than 1000 s/mm² and more specifically less than 300 s/mm², although other b-values are possible. As described, this allows the estimation blood perfusion of various organs, including blood flow and blood volume. In general, however, the acquired low resolution diffusion images may sample any portion of q-space, and include various and/or multiple q-values and directions.

Figure 3:
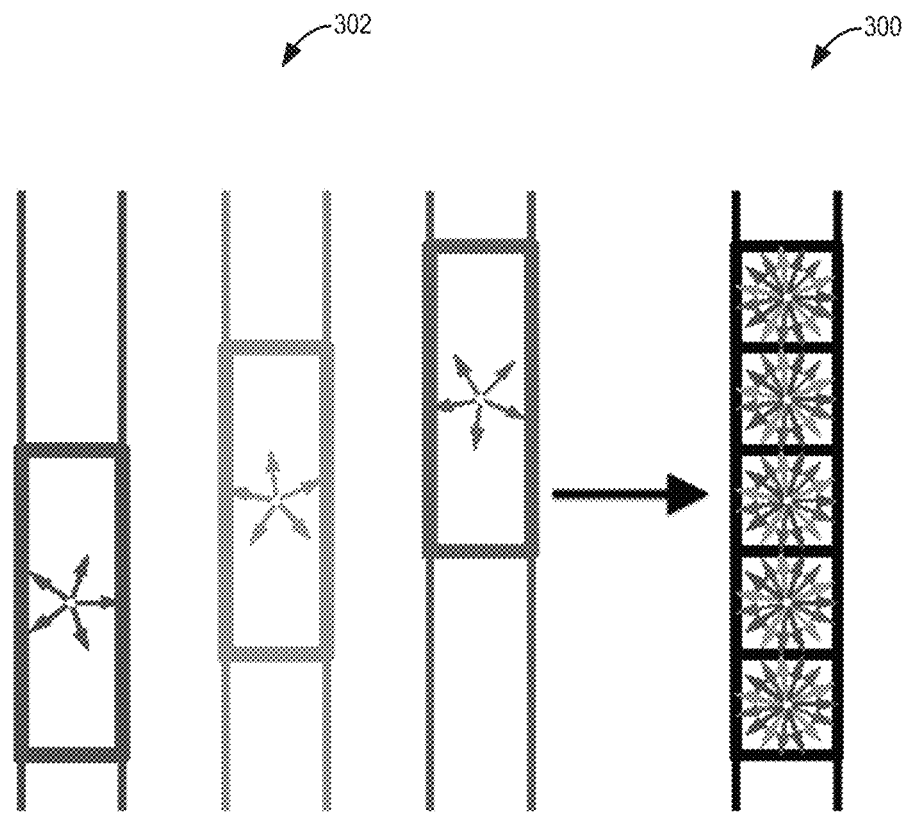
FIG. 3 is an illustration of an example data acquisition scheme, in accordance with aspects of the present disclosure.

By way of example, a high resolution image 300 may be produced using three down-sampled overlapping thick-slice low resolution images 302, as illustrated in FIG. 3. The three low resolution images 302 may be acquired using anisotropic voxel sizes that are shifted in the slice direction, such that there is appreciable overlap. In particular, each low resolution images 302 is acquired with a different (unique) set of gradient directions and used to construct a single high image with isotropic voxel size and a combined set of gradient directions. For example, up to 30 gradient directions may be utilized for each low resolution image 302, with a b-value of approximately 1000. This is in contrast to previous techniques which require low resolution scans to have the same set of gradient directions. By contrast, only a subset (for example, one-third) of the total number of gradient directions are acquired for each low resolution scan in the present approach, thus reducing scan time significantly while making the technique robust to head motion. It may be appreciated that a number of variations may be possible, including using a different number of low resolution images 302, gradient directions, b-values and so on.

Returning to FIG. 2, a model correlating diffusion signals of the received low resolution diffusion images and high resolution diffusion images may be generated at process block at process block 204. In some aspects, voxels associated with high resolution diffusion images may be represented in a sparsifying basis, such as spherical ridgelets. Then, at process block 206, one or more high resolution images may be reconstructed using the model. As will be described, reconstructing the images includes carrying out minimization of a cost function, determined using the model, that enforces sparsity and spatial consistency. In some aspects, a total variation regularization is applied at process block 206 account for diffusion signal correlations between neighboring voxels in a given high resolution diffusion image. In the reconstruction, an alternating direction method of multipliers ("ADMM") to obtain the high resolution diffusion images. In general, the above method allows for any type of post-processing analysis using any type of diffusion based model. The reconstructed data obtained therefrom is in the most general form. In addition, in some aspects, prior anatomical or tissue-specific information, obtained from T1-weighted, T2-weighted or any other image modality, may be used to reconstruction of the high resolution diffusion images.

As may be appreciated, the resolution of the low resolution images received at process block 202, and high resolution images reconstructed therefrom, may vary depending upon a number of factors, including the capabilities of the imaging system and imaging parameters utilized, the number of acquired images and image quality achievable, as well as the particular application undertaken. In this disclosure, examples are given for illustrative purposes, which are non-limiting. For instance, high resolution dMRI data with isotropic voxels approximately $0.9^3$ mm$^3$ in size can be obtained using three overlapping thick-slice acquisitions with anisotropic voxels approximately 0.9×0.9×2.7 mm$^3$ in size. In this regard, the resolution of the high resolution images reconstructed is higher along at least one direction compared to the resolution of the low resolution images utilized in the reconstruction. Conversely, the resolution of the low resolution images are lower along at least one direction compared to the resolution of the high resolution images.

As indicated by process block 208, in some aspects, the generated high resolution imaging may then be analyzed. In this regard, a variety of information may be extracted at process block 208. For example, a segmentation may be performed using the reconstructed high resolution images to generate fine anatomical details not previously achievable. As such, information associated with specific tissues, tissue boundaries, or other anatomical details identified in the analysis may be generated. In one application, a tractography may be performed using reconstructed high resolution diffusion images. As such, single or multi-dimensional imaging (1D, 2D, 3D, 4D), maps, representations, may also be generated at process block 208, although not necessarily displayed. In another application, blood flow and blood volume can be estimated using high resolution images obtained from low resolution images acquired with very low diffusion weighting.

Then at process block 210, a report of any form may be generated and provided to a user via an output. In some implementations, the report may be in the form of single or multi-dimensional imaging, maps, representations, and other information generated using high resolution imaging reconstructed in accordance with the present disclosure. The report may also characterize or provide information associated with specific tissues, tissue boundaries, various tissue connectivity, and other characteristics identified using high resolution imaging data, as described. In some aspects, the report may include imaging or representations of white matter fiber tracts of a subject's brain, and other tissues or structures, as well as information generated therefrom. In other aspects, the report may include imaging or representations of blood perfusion, including blood flow or blood volume, as well as information generated therefrom.

In general, diffusion imaging is often used for investigating the neural architecture and the connectivity of the brain. The ensemble average diffusion propagator ("EAP") is usually estimated from diffusion measurements to describe the average displacement of water molecules within a voxel during the sampling period. Such information provides important details about the structure of underlying tissue. In the narrow pulse setting (for single pulse field gradient imaging sequences), the diffusion signal S(q) is related to the EAP P(r) via the Fourier transform given by:

$$P(r) = \int_{q \in \mathbb{R}^3} E(q) \exp(-i2\pi q \cdot r) dq \quad (3)$$

with $E(q) \triangleq S(q)/S(0)$ being the normalized diffusion signal and S(q), S(0) being the diffusion signal along the gradient direction q and at the origin, respectively. The vector q in q-space is an experimentally controllable parameter, with $$q = \frac{1}{2\pi} \gamma \delta G$$

where γ is the gyromagnetic ratio and δ is the duration of the diffusion sensitizing gradient whose magnitude and orientation are determined by the vector G.

Various of methods have being devised to estimate the EAP from E(q) using measurements at different points in q-space. One such method includes Diffusion Tensor Imaging ("DTI"), which models E(q) using a Gaussian function with a single fiber orientation. However, DTI methods cannot model complex fiber architectures, such as fiber crossings, or abutting or adjacent fibers. To resolve this issue, in some aspects, a HARDI technique may be utilized, which involves acquisition of diffusion signals on a single q-shell using several gradient directions. This technique affords a lot less time compared to those that estimate the entire EAP.

As described, in some aspects spherical ridgelet functions may also be utilized to model the diffusion signal in q-space at each voxel of a given high resolution image, as described below. In particular, spherical ridgelets form a basis for representing $L_2$ functions on a unit sphere. Previously, it has been demonstrated that diffusion signals over a single b-shell can be sparsely represented in this basis. This allows the use of a compressed sensing approach to accurately reconstruct HARDI data from sparse samples.

In general, spherical ridgelets are constructed following the fundamental principles of wavelet theory. Specifically, for $x \in \mathbb{R}_+$ and $\rho \in (0,1)$, let $\kappa(x) = \exp\{-\rho x(x+1)\}$ be a function. Further, assume $$\kappa_j(x) = \kappa(2^{-j}x) = \exp\left\{-\rho\frac{x}{2^j}\left(\frac{x}{2^j}+1\right)\right\} \quad (4)$$

for $j = 0, 1, 2, \ldots$. The spherical ridgelets, with their energy spread around the great circle supported by a unit vector $V \in S^2$, may then given by:

$$\psi_{j,v}(u) = \frac{1}{2\pi} \sum_{n=0}^{\infty} \frac{2n+1}{4\pi} \lambda_n (\kappa_{j+1}(n) - \kappa_j(n)) P_n(u \cdot v), \forall u \in S^2 \quad (5)$$

where $P_n$ denotes the Legendre polynomial of order n, $\kappa_{-1}(n)=0, \forall n$ and $$\lambda_n = \begin{cases} 2\pi(-1)^{n/2}\frac{1,3\ldots(n-1)}{2,4\ldots n}, & \text{if } n \text{ is even} \\ 0 & \text{if } n \text{ is even} \end{cases} \quad (6)$$

To construct a finite over-complete dictionary, the values for the resolution index may be set to a finite set $\{-1,0,1\}$. For each resolution index, the set of all possible orientations $v \star S^2$ are discretized to a set to of $M_j = (2^{j+1}m_0+1)^2$ directions on the unit sphere with $m_0$ mo being the smallest spherical order resulting in $k_0(m_0) \leq \varepsilon$ for some predefined $0 \leq \varepsilon \ll 1$ (e.g. $\varepsilon = 10^6$). To this end, for each j, a total of $M_j$ orientations $\{vj\}_{i=1}^{M_j}$ be chosen so that the set of over-complete spherical ridgelets are given by:

$$\Psi_{SR} = \{\phi_{j,v_j^i} | k=-1,0,1,\ldots,J, i=1,2,\ldots,M_j\} \quad (7)$$

The spherical ridgelet basis functions have been shown to provide a sparse representation of the dMRI signal. In particular, it was previously shown in that a suitable implementation of spherical ridgelets can be used for reliable reconstruction of HARDI signals from as few as 16 diffusion encoded scans. However, previous work did not incorporate an isotropic basis function to sparsely represent nearly isotropic signal, as in cortical gray matter or CSF areas. Consequently, the basis of spherical ridgelets may be expanded with an isotropic function. Thus, the set of functions that is used to represent the diffusion signal is then:

$$\Psi := \{\psi_{iso}, \Psi_{SR}\} \quad (8)$$

where $\psi_{iso}$ denotes a constant function on the unit sphere. For convenience, the functions in $\Psi$ can be denoted as $\psi_1, \psi_2, \ldots, \psi_M$ with $\psi_1 = \psi_{iso}$.

Compressed sensing provides a mathematical foundation for accurate recovery of signals from a set of measurements far fewer than required by the Nyquist criteria. To illustrate this, let $E_b(u)$ be the normalized diffusion signal at a b-shell along the direction u. Using the set of functions $\Psi$, a diffusion signal can be represented as $$E_b(u) = \sum_{m=1}^{M} c_m \phi_m(u) \quad (9)$$

where only a few of the $c_m$'s are non-zero. Given a diffusion signal measured at a set of N diffusion-encoding orientations $\{u_n\}_{n=1}^{N}$, one can recover the diffusion signal on the whole sphere by estimating the representation coefficients $c_m$ in Eqn. 9. For this purpose, let $S \in S^K$ denote the vector of the diffusion signal whose nth entry is equal to $E_q(u_n)$ and let the values of $\phi_m$ for $m=1, \ldots, M$ at the N acquisition locations be stored in a N×M matrix A defined as:

$$A = \begin{bmatrix} \phi_1(u_1) & \phi_2(u_1) & \ldots & \phi_M(u_1) \\ \phi_1(u_2) & \phi_2(u_2) & \ldots & \phi_M(u_2) \\ \vdots & \vdots & \ldots & \vdots \\ \phi_1(u_N) & \phi_{21}(u_N) & \ldots & \phi_M(u_N) \end{bmatrix} \quad (10)$$

Each column of A may be scaled such that it has unit $l_2$ norm. Thus the measurement s can be represented as $$s = Ac + \mu \quad (11)$$

where c denotes the vector of representation coefficients and $\mu$ denotes the measurement noise. Since the number of measurements, N, is usually much smaller than M, it is an underdetermined problem to estimate c. On the other hand, the vector c has very few non-zero entries. Thus, the representation coefficient of the signal can be estimated by solving $$\min_c \|c\|_0 \text{ s.t. } \|s - Ac\|^2 \leq \varepsilon \quad (12)$$

where $\|c\|_0$ denotes the number of non-zero entries of c and $\in$ denotes the level of measurement noise. However, being a combinatorial problem, (3) is computationally intractable for most practical problems.

Compressed sensing provides a mathematical framework for accurate and efficient recovery of signals that can be sparsely represented in a basis. In Eqn. 12, if the optimal c is sufficiently sparse and if the columns of A have low coherence, then a solution of can be robustly recovered by solving the following convex optimization problem:

$$\min_c \|c\|_1 \text{ s.t. } \|s - Ac\|^2 \leq \varepsilon \quad (13)$$

where $\|c\|_1$ denotes the $l_1$ norm of c. From the Lagrangian multiplier method, the solution of Eqn. 13 equals to that of $$\min_c \frac{1}{2}\|s - Ac\|^2 + \lambda\|c\|_1 \quad (14)$$

for some $\lambda \geq 0$. This setup has been successfully used to reconstruct dMRI signals from sparse measurements. Several $l_1$ minimization algorithms may be applied for solving Eqn. 14.

For estimating diffusion signals, the method may be modified in the following two aspects to improve the performance, as will be described. First, the representation coefficients may be limited to be nonnegative. Second, a weighted $l_1$-minimization algorithm may be used to allow for imposing different weighting coefficients for the isotropic basis function for different brain tissues. For example, the diffusion signal in CSF areas is isotropic, hence, a much smaller penalty may be imposed for selecting the isotropic basis element in such isotropic areas. Incorporating this fact, the following modified $l_1$-minimization problem can be taken to be:

$$\min_{c \geq 0} \frac{1}{2} \|s - Ac\|^2 + \lambda \|w \circ c\|_1 \qquad (15)$$

where all the entries of c are constrained to be nonnegative. ○ denotes the element-wise multiplication, and the weighting vector $w \in \mathbb{R}_+^M$ as the form $$w = [w, 1, 1 \ldots, 1,]^T \qquad (16)$$

with $w \geq 0$ weighing the penalty for choosing an isotropic basis function. The value of w is larger in white and gray matters areas than in CSF areas. Equation 15 is a convex programming problem, which can be solved efficiently using various optimization algorithms. In particular, Eqn. 6 may be solved using an ADMM algorithm As described, a model correlating diffusion signals of the received low resolution diffusion images and high resolution diffusion imaging may be generated. To illustrate this, let $Y_k$ for $k=1, \ldots, K$ denote the K low resolution dMRI volumes. For each $Y_k$, the dMRI signal may be acquired along a set of gradient directions $U_k = \{u_1^{(k)}, \ldots, u_{N_k}^{(k)}\}$ at the same b-value. In some aspects, the gradient directions are assumed to be different for each of the low resolution volumes. In some aspects, the low resolution acquisition $Y_k$'s may be assumed to be low-pass filtered versions of the true high resolution image volume S, which has $n \times n_y \times n_z$ voxels and $N = \Sigma_{k=1}^{K} N_k$ gradient directions. Rearranging the elements of S as a matrix of size $n_x n_y n_z \times N$, the acquisition model for each low resolution image can be written as $$Y_k = D_k B_k S Q_k^T + \mu_k \text{ for } k=1, \ldots, K, \qquad (17)$$

where $D_k$ denotes the down-sampling matrix that averages neighboring slices, $B_k$ denotes the blurring operator (or point-spread function), $Q_k$ is the sub-sampling matrix in q-space and $\mu_k$ denotes the measurement noise. This model may be regarded as a generalization of the image formation model where the matrix $Q_k$ allows $Y_k$'s to have different sets of gradient directions. By contrast, in traditional super resolution models, $Q_k$ necessarily enforces each $Y_k$ to have the same set of gradient directions.

As described, spherical ridgelets may be used to model the diffusion signal at each voxel of S. Hence, S can be written $S = VA^T$ with A being the basis matrix introduced in Eqn. 10 and each row vector of V being the representation coefficients at the corresponding voxel. Each row of V, as well as the entire matrix V is sparse.

Following Eqn. 15, S can be estimated by solving $$\min_{S,V} \left\{ \frac{1}{2} \sum_{k=1}^{K} \|Y_k - D_k B_k S Q_k^T\|^2 + \lambda \|W \cdot V\|_1 \right\} \qquad (18)$$

$$\text{s.t. } S - VA^T = 0, V \geq 0$$

where W is a weighting matrix to adjust the penalty for selecting the isotropic element in A at each voxel based on using prior anatomical information regarding the tissue type (gray, white or CSF). The quadratic term in Eqn. 18 corresponds to the assumption that the noise components in $Y_k$'s follow Gaussian distributions. For other type of distributions, such as Rician distributions, the quadratic term can be replaced by the corresponding log-likelihood functions. However, the Gaussian assumption is valid for high SNR (SNR>5). Moreover, using a quadratic term in Eqn. 18 can lead to a computationally efficient algorithm, which is preferred for solving large scale optimization problems. It may be noted that the $l_1$-norm regularization in Eqn. 18 is carried out for each individual voxel. Therefore, the correlation between the diffusion signals from neighboring voxels is not considered. However, such prior knowledge can be incorporated by adding a spatial-regularization term, as described below. Taking advantage of neighboring voxel information can help improve the performance of the CS-SRR approach described.

To illustrate this, let $s_r(u_n)$ denote the diffusion signal along the direction $u_n$ at the voxel indexed by $r \in \Omega$, with $\Omega$ being the set of coordinates of all voxels. The diffusion signal at all voxels along the gradient $u_n$ forms a 3D image volume denoted by $S_n$. Due to the correlation of diffusion signal in neighboring voxels, $S_n$ can be assumed to have a spatially smooth structure. A total-variation ("TV") semi-norm of $S_n$ may then be used, defined as $$\|S_n\|_{TV} = \sum_{r \in \Omega} \left[ \sum_{p \in N(r)} |s_r(u_n) - s_p(u_n)|^2 \right]^{1/2} \qquad (19)$$

where $N(r)$ denotes the set of neighbors of r, defined with $r = [i,j,k]$ as $$N(r) = \{[i-1,j,k], [i,j-1,k], [i,j,k-1]\} \qquad (20)$$

For a collection of image volumes $S = \{S_n\}_{n=1}^{N}$, the TV semi-norm of S may be defined as the sum of the TV semi-norm of each individual volume $S_n$, namely $$\|S_n\|_{TV} = \sum_{n=1}^{N} \|S_n\|_{TV}. \qquad (21)$$

By adding this regularization term in Eqn. 18, the optimization problem can then be rewritten as $$\min_{S,V} \left\{ \frac{1}{2} \sum_{k=1}^{K} \|Y_k - D_k B_k S Q_k^T\|^2 + \lambda_1 \|W \cdot V\|_1 + \lambda_2 \|S\|_{TV} \right\} \qquad (22)$$

$$\text{s.t. } S - VA^T = 0, V \geq 0$$

where the positive parameters $\lambda_1, \lambda_2$ determine the relative importance of the data fitting terms versus the sparsity and the TV regularization terms. Next, an efficient algorithm is described for solving Eqn. 22 using an alternating direction method of multipliers ("ADMM") technique.

The optimization problem of Eqn. 22 typically involves high dimensional optimization variables. A suitable implementation of the ADMM algorithm distributes the computational cost and decomposes the optimization into a sequence of simpler problems. First, Eqn. 22 can be equivalently written as $$\min_{V \geq 0, S, Z} \left\{ \frac{1}{2} \sum_{k=1}^{K} \|Y_k - D_k B_k S Q_k^T\|^2 + \lambda_1 \|W \cdot V\|_1 + \right. \tag{23}$$

$$\left. \lambda_2 \|S\|_{TV} + \frac{\rho_1}{2} \|S - VA^T\|^2 + \frac{\rho_2}{2} \|S - Z\|^2 \right\}$$

s.t. $S - VA^T = 0, H - Z = 0$ where Z is an auxiliary variable that equals to S, and the augmented terms $$\frac{\rho_1}{2} \|S - VA^T\|^2 + \frac{\rho_2}{2} \|S - Z\|^2$$

with $\rho_1, \rho_2 \geq 0$ do not change the optimal value. Let $\Lambda_1, \Lambda_2$ be the multipliers for $S - VA^T = 0$ and $S - Z = 0$, respectively. Then, each iteration of the ADMM algorithm consists of several steps of alternately minimizing the augmented Lagrangian $$\frac{1}{2} \sum_{k=1}^{K} \|Y_k - D_k B_k S Q_k^T\|^2 + \lambda_1 \|W \cdot V\|_1 + \tag{24}$$

$$\lambda_2 \|S\|_{TV} + \frac{\rho_1}{2} \|S - VA^T + \Lambda_1\|^2 + \frac{\rho_2}{2} \|S - Z + \Lambda_2\|^2$$

over S, V, Z and one step of updating $\Lambda_1, \Lambda_2$. More specifically, let $S^t$, $V^t$, $Z^t$ and $\Lambda^t$, $\Lambda_2^t$ denote the values of these variables at iteration t. Then, iteration (t+1) consists of two steps of estimating $\{V^{t+1}, Z^{t+1}\}$ and $H^{t+1}$ by solving $$\min_{V \geq 0, Z} \left\{ \lambda_1 \|W \cdot V\|_1 + \lambda_2 \|Z\|_{TV} + \right. \tag{25}$$

$$\left. \frac{\rho_1}{2} \|S^t - VA^T + \Lambda_1^t\|^2 + \frac{\rho_2}{2} \|S^t - Z + \Lambda_2^t\|^2 \right\}$$

$$\min_{S} \left\{ \frac{1}{2} \sum_{k=1}^{K} \|Y_k - D_k B_k S Q_k^T\|^2 + \right. \tag{26}$$

$$\left. \frac{\rho_1}{2} \|S - V^{t+1} A^T + \Lambda_1^t\|^2 + \frac{\rho_2}{2} \|S - Z^{t+1} + \Lambda_2^t\|_{TV}^2 \right\}$$

and one step of updating the multipliers as $$\Lambda_1^{t+1} = \Lambda_1^t + (S^{t+1} - V^{t+1} A^T), \Lambda_2^{t+1} = \Lambda_2^t + (S^{t+1} - Z^{t+1}). \tag{27}$$

A typical stopping criteria could be to verify whether $\Lambda_1^t$ and $\Lambda_2^t$ have "stopped changing" i.e. $\|\zeta_1^{t+1} - \zeta_1^t\|^2 \leq \varepsilon_1$ and $\|\Lambda_2^{t+1} - \Lambda_2^t\|^2 \leq \varepsilon_2$ for some user defined choice of $\varepsilon_1, \varepsilon_2$.

Several features may be noted regarding the iterative algorithm described above. In particular, the problem of Eqn. 25 can be decomposed into two independent optimization problems in order to solve V and Z. The update for $V^t$ is then obtained by solving an $l_1$-minimization problem with non-negative constraints using the algorithm in appendix. In particular, the solution for each voxel can be obtained independently or in parallel. In addition, the update for $Z^t$ is a standard TV denoising problem, which can be efficiently solved using a number of approaches. Moreover, Eqn. 26 is a least-squared problem involving a matrix inversion for compute the closed-form solution. In particular, $[Q_1, \ldots, Q_k]$ is a permutation matrix since the sets of gradient direction for the low resolution $Y_k$'s are not overlapping. Let $\hat{S}_k := S Q_k^T$ for $k=1, \ldots, K$. Hence. the update procedure for each $\hat{S}_k$ are independent with each other. The value of $\hat{S}_k$ at iteration (t+1) is the solution of the least-squares problem $$\min_{S} \left\{ \frac{1}{2} \sum_{k=1}^{K} \|Y_k - D_k B_k \hat{S}_k\|^2 + \right. \tag{28}$$

$$\left. \frac{\rho_1}{2} \|\hat{S}_k - (V^{t+1} A^T - \Lambda_1^t) Q_k^T\|^2 + \frac{\rho_2}{2} \|\hat{S}_k - (Z^{t+1} - \Lambda_2^t) Q_k^T\|^2 \right\}$$

which is given by $$(B_k^T D_k^T D_k B_k + (\rho_1 + \rho_2) I)^{-1} \{D_k^T B_k^T Y_k + \rho_1 (V^{t+1} A^T - \Lambda_1^t) Q_k^T + \rho_2 (Z_{t+1} - \Lambda_2^t) Q_k^T\} \tag{29}$$

It is noted that the down-sampling operator $D_k B_k$ determines the dimension of matrices to be inverted in Eqn. 29. In the particular situation where $D_k$ and $B_k$ down-samples and blurs the image along the z direction, a matrix of size $n_z \times n_z$ necessitates inversion, a process easily carried out on a standard workstation. In a more general situation when the matrix size is large, an alternative method may be used, namely a steepest descent iterative method.

The above-described method and system may be further understood by way of example. The example is offered for illustrative purposes only, and is not intended to limit the scope of the present invention in any way. Indeed various modifications in addition to those shown and described herein will become apparent to those skilled in the art from the foregoing descriptions and the following example, and fall within the scope of the appended claims.

EXAMPLE

The performance of the above-described approach was tested using three experiments. In the first one, thick-slice acquisitions were generated by slice averaging and blurring high resolution data obtained from the Human Connectome Project ("HCP"). The second and the third experiments included actual validation setups where a compressed sensing super resolution reconstruction ("CS-SRR") approach was applied to low resolution imaging acquired from a healthy human subject using a 3T Siemens clinical scanner. The recovered high resolution results were compared with the corresponding high resolution gold-standard ("GS") using the following metrics:

1) Percentage of fractional anisotropy ("FA") difference: Whole brain multi-tensor tractography was computed on the GS and the reconstructed data, and several fiber bundles were extracted. The average FA and trace for tensors along the fiber bundles were computed. The percentage of FA difference was computed using $|FA_{CS-SRR} - FA_{GS}|/FA_{GS}$. The percentage of trace difference was defined in an analogous fashion.

Error in long-range fiber connectivity tractography: Tractography is a useful tool to study brain connectivity and network layout. Any reconstruction method should be able to produce similar white matter tracts as one would expect from the actual ground truth data. In the present experiments, a multi-tensor tractography algorithm was used to trace fiber bundles for the GS and the CS-SRR data sets. For quantitative comparison between the obtained tracts, a metric based on the probability distribution function ("pdf") of the physical coordinate of the tracts as utilized. In particular, let $p_x, p_y,$ and $p_z$ be the probability distribution functions of the x, y, z of the fiber tracts obtained from the GS data set. Let $\hat{p}_x, \hat{p}_y,$ and $\hat{p}_z$ be the corresponding probability distribution functions for the CS-SRR data set. Then, the similarity between two fiber bundles can be computed using the following:

$$\frac{1}{3}\left(\left\langle p_x^{\frac{1}{2}}, \hat{p}_x^{\frac{1}{2}}\right\rangle + \left\langle p_y^{\frac{1}{2}}, \hat{p}_y^{\frac{1}{2}}\right\rangle + \left\langle p_z^{\frac{1}{2}}, \hat{p}_z^{\frac{1}{2}}\right\rangle\right) \quad (30)$$

which is the average Bhattacharyya coefficient between the three pairs of marginal probability distribution function, and takes value in the interval [0, 1]. A value of 1 indicates exact match between the fiber bundles, whereas a value of 0 indicates complete mismatch between the two set of tracts.

In the first experiment, HCP data having a spatial resolution of 1.25×1.25×1.25 mm³ with 90 gradient directions at b=2000 s/mm² was utilized. To construct LR images, the DWI volumes were artificially blurred along the slice direction using a Gaussian kernel with full width at half maximum ("FWHM") of 1.25 mm. Then the data was down-sampled by averaging three contiguous slices to obtain a single thick-slice volume with spatial resolution of 1.25×1.25×3.75 mm³. Similarly, two additional LR volumes were obtained so that all the three LR volumes were slice-shifted in physical space (as shown in FIG. 3). The thick-slice volumes were also sub-sampled in q-space so that each set had 30 unique gradient directions.

A segmentation of the brain was also performed to include three tissue types, namely, gray matter, white matter and cerebrospinal fluid ("CSF"). In particular, the segmentation was carried out using acquired T1-weighted ("T1w") MR images. Tissue classifications were used as a prior, setting w=$10^{-4}$ in CSF and w=1 in gray and white matter areas (Eqn. 15). The regularization parameter was selected to be $\lambda_1$=0.01, and the auxiliary parameter was set to $\rho_1$=1. Since the measurement model was known perfectly in this example, the total-variation denoising term was disregarded by setting the parameter $\lambda_2$=0. Hence, the reconstruction results manifest the effectiveness of the spherical ridgelets and the $l_1$ regularization terms.

To compare the tractography results, fiber bundles were traced using GS and reconstructed data sets. Next, the cingulum bundle ("CB"), the corticospinal tract ("CST"), the superior longitudinal fasciculus II ("SLF-II") and a sub-part of the corpus callosum called caudal middle frontal bundle ("CC-CMF"), were extracted using the white matter query language ("WMQL"), which uses Freesurfer cortical parcellations. The four pairs of fiber bundles are shown in FIG. 4, with red and yellows tracts obtained using the GS and CS-SRR data sets, respectively.

A comparison between the metrics computed for the different fiber bundles is summarized in Table 1. As shown, the fiber-bundle overlap measures were very close to one, indicating a significant overlap between the fiber bundles obtained using the GS and CSSRR data. The estimated average FA and trace were very similar for both data sets, and the percentage error for FA and trace were within the typical range of variations from different acquisitions. In particular, it was observed that the CC-CMF had higher trace error and lower fiber-bundler overlap compared with other fiber bundles, potentially due to down-sampling operator that mixes the voxels in corpus callous and the CSF areas. However, in the true scenarios described below, the tractography results for the fibers bundles in corpus callosum turn out to have better performance.

TABLE 1

Figure 4:
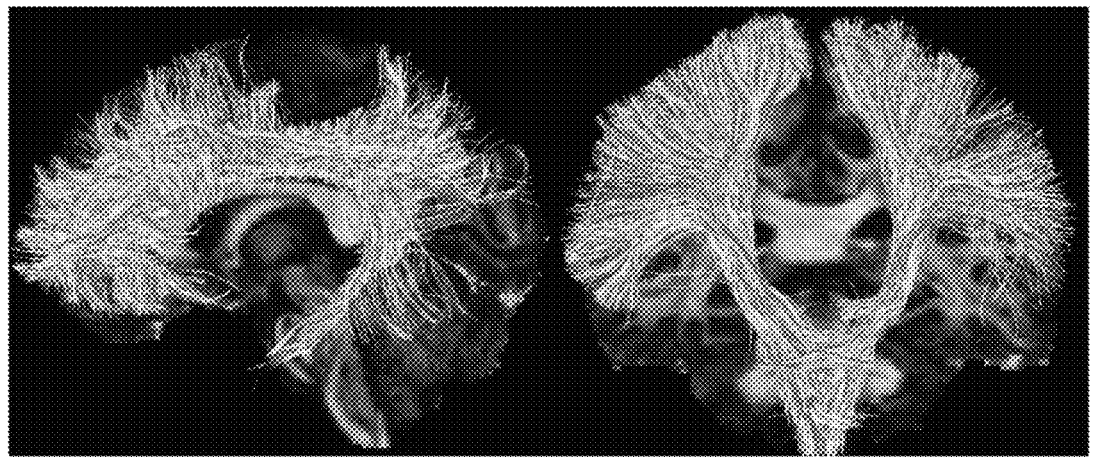
FIG. 4 show tractography results for different fiber bundles generated in accordance with aspects of the present disclosure.
Figure 4:
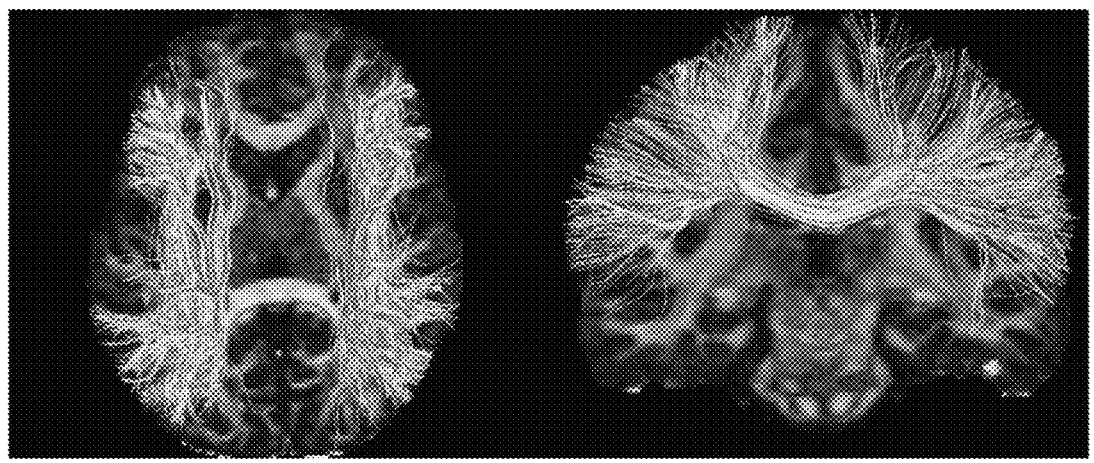

Comparison metrics for different fiber bundles shown in FIG. 4.

| | FA difference | Trace difference | Fiber-bundle overlap |
|---|---|---|---|
| CB | 2.8% | 1.8% | 0.97 |
| CST | 4.0% | 1.2% | 0.98 |
| SLF-II | 3.6% | 1.6% | 0.95 |
| CC-CMF | 3.1% | 3.2% | 0.95 |

Figure 5:
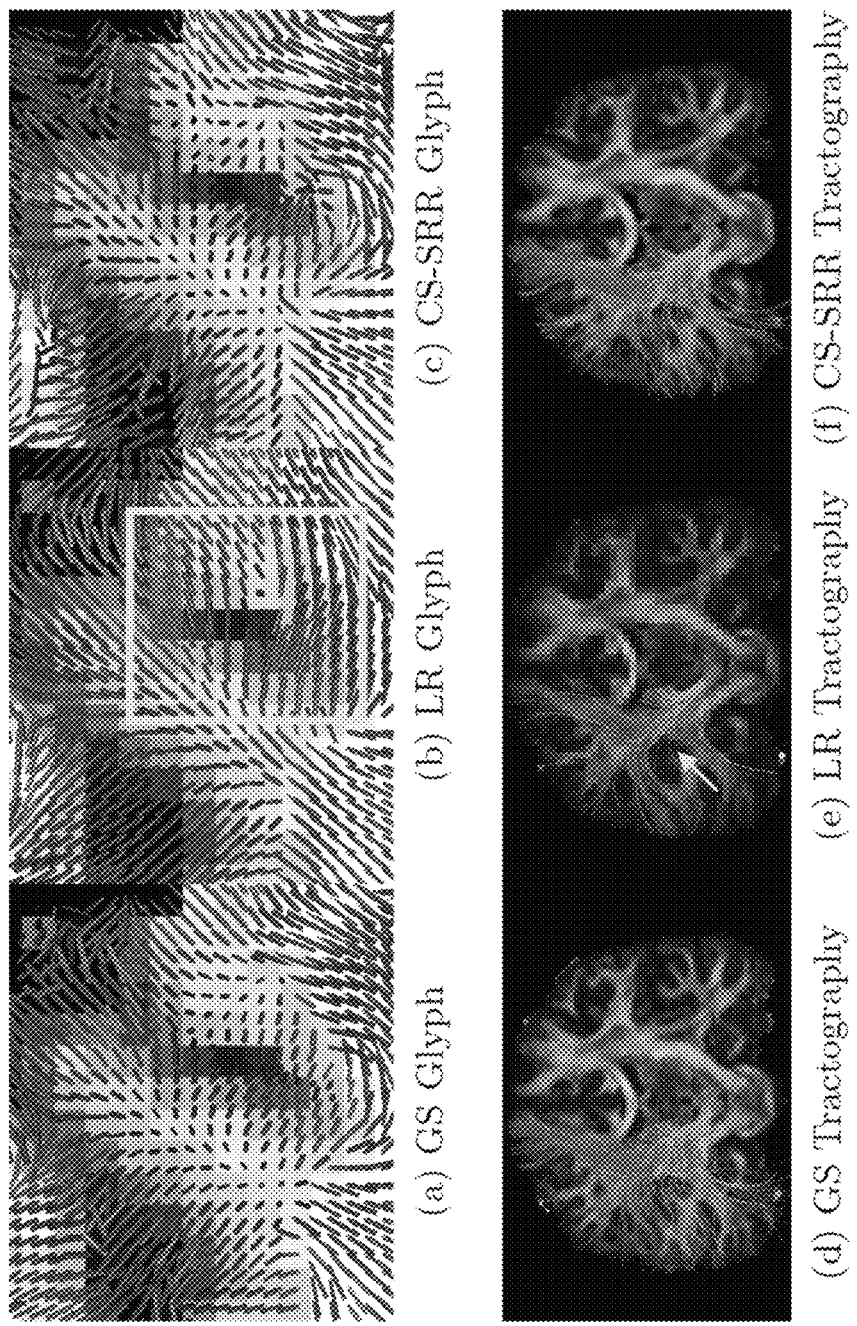
FIG. 5 is a graphical illustration comparing single tensor and tractography results, generated in accordance with present disclosure, with present gold standard and low resolution approaches.

An important objective of this work was to demonstrate the advantage of using high resolution DWI image in studying small white-matter fascicles. For this purpose, a low-resolution DWI volume was generated by averaging every 2×2×2 neighboring voxels from the GS data to obtain LR dMRI data with isotropic voxel size of 2.53 mm³. FIG. 5a-c shows the single-tensor glyphs color coded by the direction of the dominant eigenvector of the diffusion tensors for the GS, LR and SRR data sets in the same brain region from a coronal slice. The background of the glyphs is the corresponding T1w image. As visible from in the rectangular area shown FIG. 5, the LR image was not able to capture the fine curvature of the fiber bundles near the gray matter areas due to partial-volume effects. FIG. 5d-f show the tractography results for tracts originating from the sub-thalamic nucleus, with fibers being color-coded by orientation. As indicated by the arrow in FIG. 5e, most of the green fibers were missing in the LR image, though the number of seeds in each voxel of the LR image was 8 times higher than the HR images. On the other hand, the tracts obtained from the GS and CS-SRR data were very similar.

A significant advantage can be gained in acquisition time by using sub-sampled thick-slice acquisitions. In the above experiment, it was shown that using 30 diffusion gradients for each of the thick-slice acquisitions provides satisfying results that are similar to the gold-standard data. From a practical viewpoint, it may be desirable to include a varied number of samples. To this end, 4 additional scenarios were investigated, whereby 10, 15, 20 and 25 gradient directions were used for each thick-slice acquisition. In order to create these thick-slice data sets with measurements uniformly spread over the sphere for each LR image, spherical harmonics of order 8 were used to interpolate the signal on a dense grid followed by sub-sampling along the desired gradient directions. Each of the four sets of gradient directions were chosen so that they were quasi-uniformly distributed on the hemisphere. Following the same approach, HR images were generated, and whole-brain tractography results were computed and extracted for the CB, CST, SLF-II and CC-CMF tractography. For comparison, the normalized FA error, normalized trace error and the fiber-bundle overlap compared to the gold standard were computed.

Figure 6:
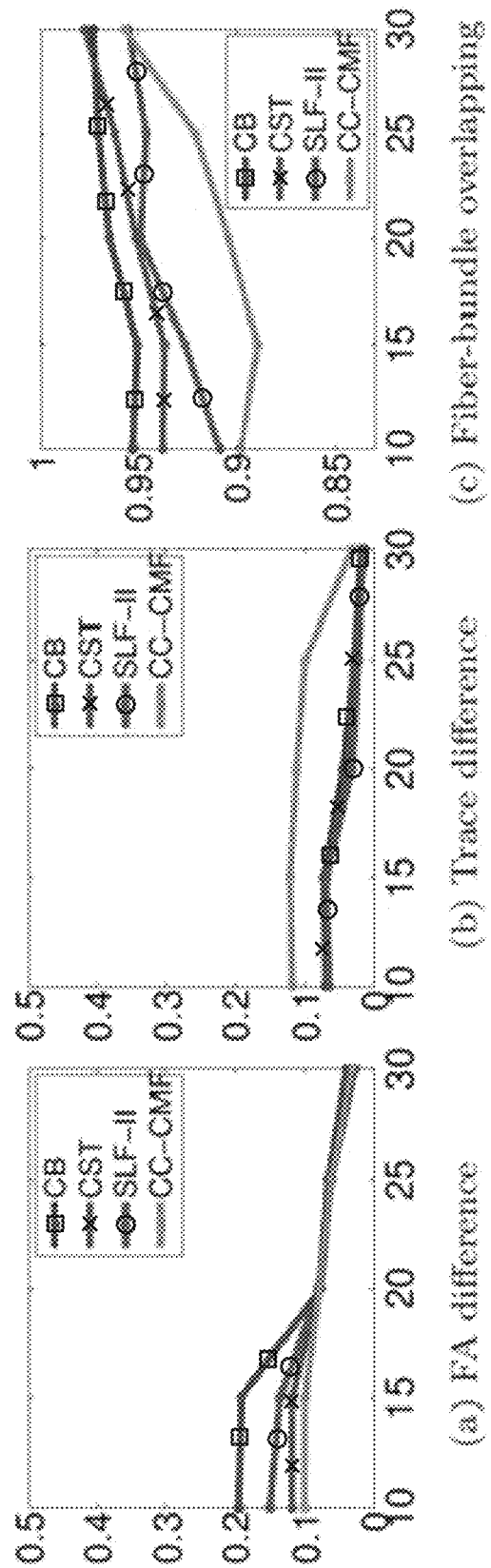
FIG. 6 is a graphical illustration showing comparison metrics computed for several brain structures using a gold standard as a function of the number of gradient directions.

FIG. 6a-c show the normalized difference in FA, trace and fiber bundle overlap for the four sets of tractography results versus the number of gradient directions used for the thick-slice images. The FA error and Trace error monotonically decreased with increasing number of gradient directions. In particular, using 20 gradient directions, the normalized FA error for all tracts was about 0.08 and the normalized trace error was about 0.04 which are similar to typical range of variations expected with different scans of varying spatial resolutions. On the other hand, the fiber-bundle overlap shown in FIG. 6c monotonically increased with increasing number of samples. For only 10 gradient directions, the fiber-bundle overlap for all the tracts was about 0.9 or higher.

As described, the second experiment was based on a data set acquired on a 3T Siemens Trio clinical scanner (maximum gradient strength of 40 mT/m). Specifically, three overlapping thick-slice scans were acquired with spatial resolution of $1.2 \times 1.2 \times 3.6$ mm$^3$. The DWI volumes were sub-pixel shifted by 1.2 mm along the slice-select direction. Each LR DMI had a set of 30 unique gradient directions with b=1000 and TE=89, T R=6300 ms. For comparison, 9 acquisitions (with 90 gradient directions each) of the same subject were performed with a spatial resolution of $1.2 \times 1.2 \times 1.2$ mm$^3$, which was used as the gold standard data. Due to time limitations, these high resolution scans had partial brain coverage (it took more than 1.5 hours to obtain these 9 scans). The average of these 9 scans (after motion correction) was considered as the gold standard. A high resolution $b_0$ and T1w image to obtain tissue classification for prior information used in the present algorithm. To ensure that the LR DWI's were in the same spatial coordinate system, the whole-brain $b_0$ image was first down-sampled to produce three thick-slice volumes which were considered as the reference images. These images were only used for spatial normalization and not in the actual reconstruction algorithm. Then, the three acquired thick-slice LR DWI scans were registered to the corresponding reference volumes. The T1w was registered to the whole-brain $b_0$ image using a nonlinear transformation. The registered T1w image was then segmented into different tissue types. The FWHM of the blurring kernel was set to 1.2 mm, $\lambda_1$=0.005, $\lambda_2$=0.05, $\rho_1,\rho_2$=1 and w=0.01 in CSF area and w=1 in gray and white matter. These parameters were learned using search experiments based on one slice of the image so that the reconstruction error was small compared with the gold-standard. For computing quantitative metrics, the reconstructed whole-brain data was registered to the partial-brain GS data set.

Tractography was carried out using reconstructed and gold standard partial-brain data sets, as described. Since whole-brain FreeSurfer cortical parcellation was not available, manually selected regions of interest ("ROI's") were used to extract fiber bundles in the corpus callosum ("CC") and the corticospinal tract ("CST"), shown in FIGS. 7a and 7b, respectively. Quantitative comparison metrics for the two pairs of fiber bundles are shown in Table 2. Differences between FA and trace obtained from both data sets were similar to those above. The Hellinger distance between the tracts indicated a significant overlap between the fiber bundles.

TABLE 2

Figure 7:
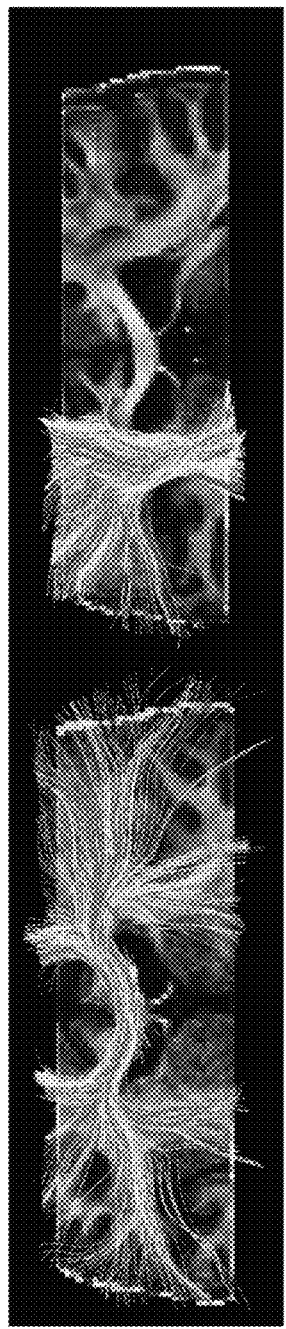
FIG. 7 shows tractography results with manually selected seeds in the corpus callosum and corticospinal tract of the present approach in comparison with the gold standard.

Comparison metrics for the fiber bundles shown in FIG. 7.

|  | FA difference | Trace difference | Fiber-bundle overlap |
| --- | --- | --- | --- |
| CC | 1.6% | 9.1% | 0.96 |
| CST | 3.2% | 10% | 0.94 |

Figure 8:
FIG. 8 shows tensor glyphs coded by fiber orientation for gold standard, low resolution and high resolution data sets, generated in accordance with aspects of the present disclosure.

To demonstrate differences between HR and LR images, a LR image was generated by neighboring voxel in the GS data set. In particular, every 2×2×2 neighboring voxel was averaged to obtaining a LR dMRI data set with isotropic voxel size of 2.43 mm$^3$. FIG. 8 shows the single tensor glyphs color coded by direction for the GS, LR and the CS-SRR data sets in the same brain region from a coronal slice. The background of the glyphs included the corresponding T1w image. As pointed out in the rectangular region of FIG. 8b the LR image was not able to capture the correct fiber orientations near the gray matter areas due to partial-volume effects. By contrast, FIG. 8c was similar to FIG. 8a, indicating that the present approach was able to correctly reconstruct the fiber orientations near gray-matter areas.

As described, the third experiment was based on whole-brain data sets acquired using a 3T scanner with a maximum magnetic gradient at 300 mT/m. The strong magnetic gradients allowed acquisition of high in-plane resolution thick-slice DWI volumes with a voxel size of $0.9 \times 0.9 \times 2.7$ mm$^3$ and TE/TR=84/7600 ms. Each LR DWI had a set of 20 unique gradient directions at b=2000 s/mm$^2$. One acquisition of isotropic LR DWI was also performed with a spatial resolution of 1.83 mm$^3$ and with 60 gradient directions at b=2000 s/mm$^2$, which is the typical spatial resolution for many clinical neuroimaging studies. High resolution T1w and a T2w images with 0.9 mm$^3$ isotropic voxels were also acquired. For this experiment, the FWHM of the blurring kernel was set to 0.9 mm, $\lambda_1$=$\lambda_2$=0.02, $\rho_1,\rho_2$=1 and w=0.01 in CSF area and w=1 in gray and white matter.

Whole brain tractography was computed for the LR data set (with 1.83 mm$^3$ isotropic voxels) and the CS-SRR data set (with 0.93 mm$^3$ isotropic voxels) using the multi-tensor tractography algorithm. The number of seeds for the LR isotropic data was set to eight times higher than that for the CS-SRR data (for proper comparison). FIGS. 9a-d show the cingulate bundle ("CB"), the corticospinal tract ("CST"), the superior longitudinal fasciculus II ("SLF-II") and the caudal middle bundle of the corpus callosum ("CC-CMF") of the LR and CS-SRR data sets distinguished by red and yellow respectively, respectively. The comparison metrics between the fiber bundles are summarized in Table 3. The FA and trace for all the bundles had similar values. It is noted that the fiber-bundle overlap for the CC-CMF was lower than the values of the other bundles, likely caused by the fact that LR tractography failed in detecting some fibers, as indicated by the arrows in FIG. 9d.

TABLE 3

Figure 9:
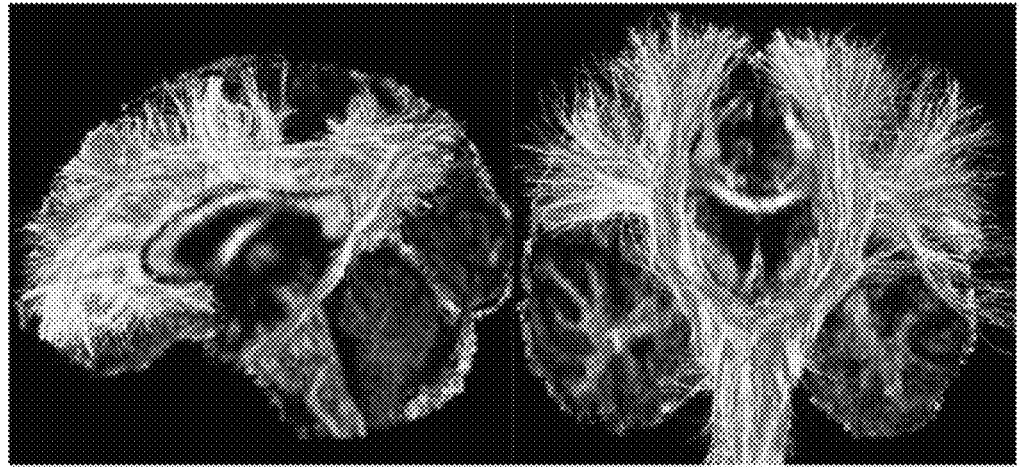
FIG. 9 shows tractography results for the cingulum bundle, the corticospinal tract, the superior longitudinal fasciculus II, and the corpus callosum caudal middle frontal bundle using low resolution and high resolution imaging data, generated in accordance with aspects of the present disclosure.
Figure 9:
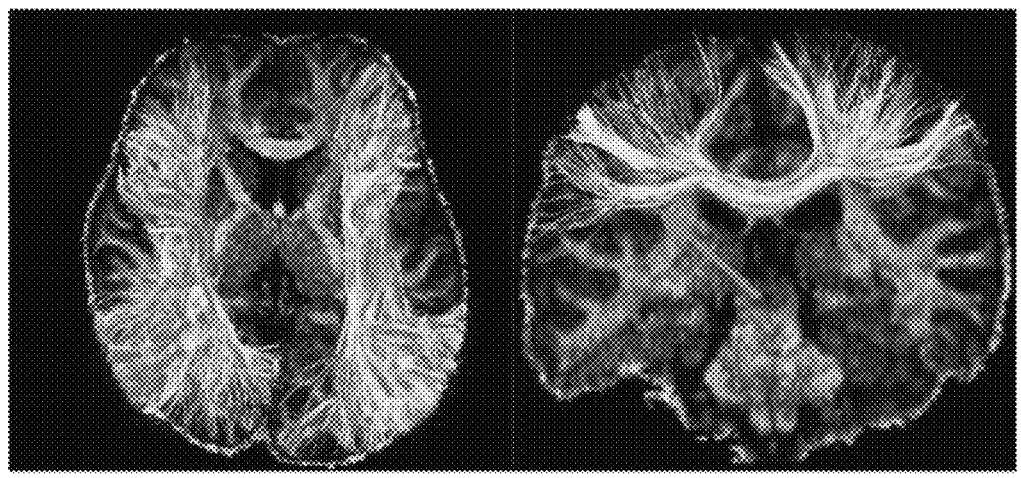

Comparison metrics for the fiber bundles of shown in FIG. 9.

|  | FA difference | Trace difference | Fiber-bundle overlap |
| --- | --- | --- | --- |
| CB | 1.2% | 1.7% | 0.94 |
| CST | 1.4% | 4.1% | 0.92 |
| SLF-II | 5.6% | 1.8% | 0.92 |
| CC-CMF | 0.5% | 1.1% | 0.85 |

Figure 10:
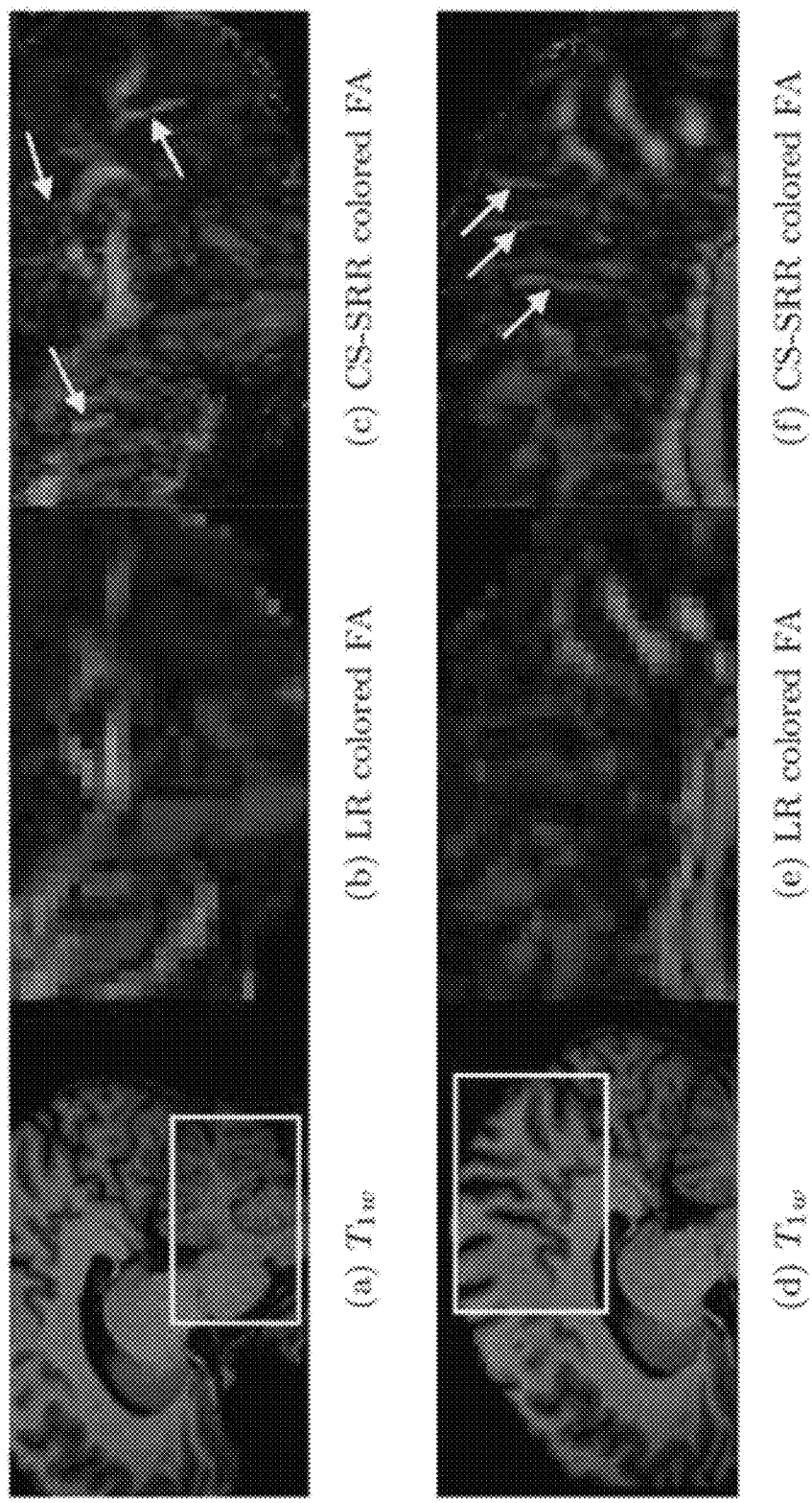
FIG. 10 shows a comparison fractional anisotropy ("FA") images of different brain regions generated using low resolution and high resolution imaging data, in accordance with aspects of the present disclosure.
Figure 11:
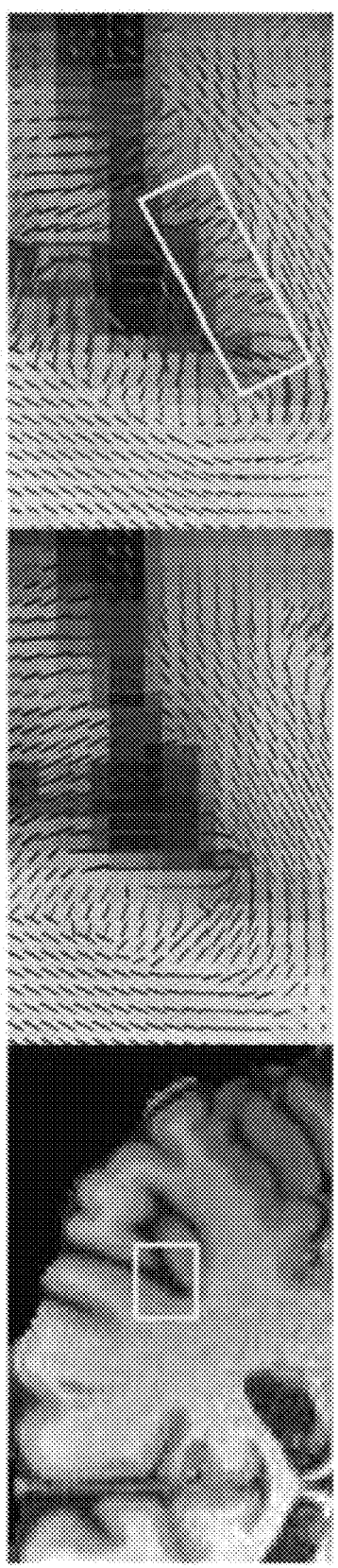
FIG. 11 shows single-tensor glyphs around a brain sulcus generated using low resolution and high resolution imaging data, in accordance with aspects of the present disclosure.

As an example, FIGS. 10b and 10c show the color coded FA images obtained using the LR and CS-SRR data sets for the pons and parietal region as indicated by the rectangle in FIG. 10a. In particular, in contrast to the LR results, the CS-SRR FA image shows clear demarcation between the fine laminar oriented structure (indicated by the left arrow in FIG. 10c) in the pons and the cerebellum (indicated by the middle and right arrow in FIG. 10c). These features are missed in the FA image obtained using LR data (FIG. 10b). Similarly, FIGS. 10e and 10f show color coded FA images of the LR and CS-SRR data sets for the cortical parietal region (FIG. 10d). As indicated by the arrows in FIG. 10f, results based on CS-SRR data was able to detect the fine white-matter structures near the cortical region which cannot be seen in the LR results As another example, FIG. 11a shows a coronal view of another brain region. As appreciated from the single-tensor glyphs (color coded by orientations) obtained using LR (FIG. 11b) and CS-SRR (FIG. 11c) data, the results generated using the CS-SRR data provides detail of the fiber orientation near the sulcus shown in FIG. 11a that is completely missing from the LR data, as indicated by the rectangular box in FIG. 11c.

Figure 12:
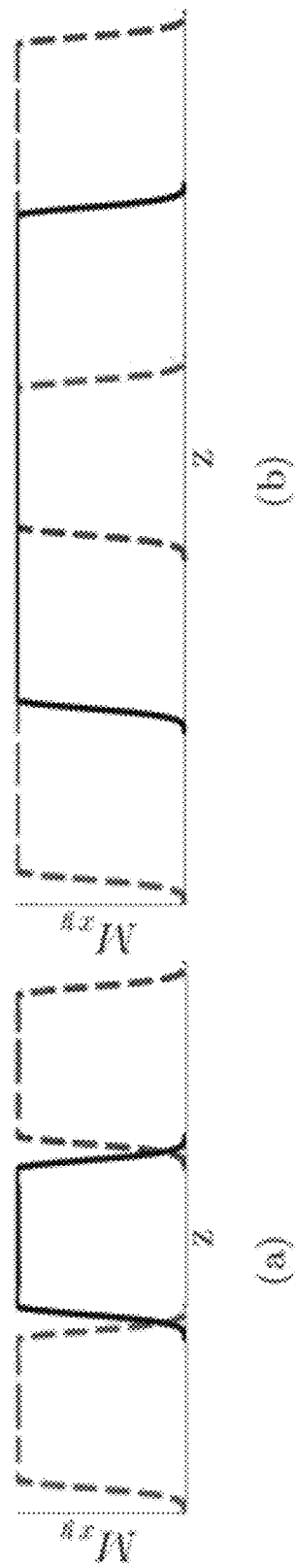
FIG. 12 is a graphical illustration depicting magnetizations for three contiguous thin-slice acquisitions compared to overlapping thick-slice acquisitions, in accordance with aspects of the present disclosure.

Before concluding, some practical points regarding thick-slice acquisitions are noted. Specifically, since diffusion images are usually acquired using echo planar imaging ("EPI"), overlapping thick-slice acquisitions not only improve SNR but may also provide some extra information about the underlying tissue compared to a thin-slice acquisition. For example, FIGS. 12a and 12b illustrate the magnetization of three contiguous slices for thin-slice acquisitions and overlapping thick-slice acquisitions, respectively. Since the slice selection is usually not perfect, the signal contribution from the tissue near the edge and between any two thin slices is usually very small. On the other hand, overlapping measurements have signal contribution from all regions of the tissue, which is not obtained in non-overlapping thin-slice images. In this aspect, thick-slice acquisitions, as shown in FIG. 12b may provide added value.

In the above, several in-vivo human experiments are described, demonstrating that improved spatial resolution for dMRI data is desirable for determining accurate tracing of white matter fibers, as well as gray matter topography. In the present approach that combines concepts of compressed sensing and super-resolution, a practical diffusion acquisition and reconstruction scheme is provided, which allows for obtaining very high spatial resolution dMRI data. In particular, it was shown that high resolution dMRI data with isotropic voxels of size 0.93 mm$^3$ sampling 60 gradient directions can be obtained using three overlapping thick-slice acquisitions with anisotropic voxels of size 0.9×0.9×2 7 mm$^3$ acquired along 20 directions. However, it is envisioned that the present approach is not limited to this particular spatial resolution or number of gradient directions. For instance, an even higher spatial resolution may be achievable by using an MRI scanner capable of acquire such data with reasonable SNR. In addition, the proposed technique is independent of scanner type and can be implemented on any clinical scanner.

Another important contribution of this disclosure includes the ability to obtain high resolution scans within a clinically feasible scan time. For example, from experiments described, a total of 60 gradient directions on a single b-shell was enough to obtain very high spatial resolution images. This is in contrast to standard techniques which would require several hours of scanning to obtain equivalent results. Moreover, if one uses the standard super-resolution setting, the scan time would be at least 3 times longer. Thus, the present CS-SRR approach allows for obtaining very high resolution scans in about the same time as a standard dMRI scan. In addition, it is envisioned that acquisition time can be further reduced by a straightforward use of multi-band (or multi-slice) acquisition sequences.

It may be noted that in some situations large motion may occur between the shifted LR acquisitions, resulting in very little or no overlap between contiguous regions. Thus, if large head motion is expected, it might be advantageous to acquire a number overlapping acquisitions, for example more than 3, in order to ensure good data reconstruction quality.

In addition, in the present scheme, parameters were set according to the SNR of the LR scans. For example, higher noise included more spatial regularization and hence a higher $\lambda_2$. In this regard, it is envisioned that automatically determining these parameters based on the estimated noise in the data would be a natural extension of this technique. Of note is that small differences in parameter settings need not significantly change the results. Hence, parameter settings as described can be applied to any other data sets acquired using similar setups. Moreover, the total variation denoising method was used to regularize the spatial smoothness of the data mainly due to its simplicity in implementation. Though this provided satisfactory results, other more advanced methods, such as total generalized variation techniques, can be expected to provide more robust performance when pursuing higher resolutions.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing high resolution diffusion imaging, the method comprising:
    receiving a plurality of low resolution diffusion images, each acquired with a different set of gradient directions and shifted in a slice direction;
    generating a model correlating diffusion signals associated with the plurality of low resolution diffusion images and a high resolution diffusion image; and
    reconstructing the high resolution diffusion image by minimizing a cost function determined using the model.

2. The method of claim 1, wherein the method further comprises performing an echo planar imaging sequence using a magnetic resonance imaging ("MRI") system to acquire the low resolution diffusion images.

3. The method of claim 1, wherein each of the plurality of low resolution diffusion images samples at least one portion of q-space.

4. The method of claim 3, wherein the at least one portion of q-space comprises a spherical shell in q-space.

5. The method of claim 1, wherein the plurality of low resolution diffusion images comprise anisotropic voxel sizes.

6. The method of claim 1, wherein the plurality of low resolution diffusion images overlap in the slice direction.

7. The method of claim 1, wherein in the model, voxels associated with the high resolution diffusion image are represented in a sparsifying basis.

8. The method of claim 7, wherein the sparsifying basis comprises spherical ridgelets.

9. The method of claim 1, wherein the method further comprises performing an alternating direction method of multipliers to reconstruct the high resolution diffusion image.

10. The method of claim 1, wherein the method further comprises performing a tractography using the reconstructed high resolution diffusion image.

11. The method of claim 1, wherein the method further comprises applying a total variation regularization to account for diffusion signal correlations between neighboring voxels in the high resolution diffusion image.

12. The method of claim 1, wherein the method further comprises analyzing the high resolution diffusion image to estimate at least one of a blood flow, or a blood volume, or both.

13. A system for producing high resolution diffusion information from a subject, the method comprising:
    an input configured to receive imaging data obtained from a subject using a magnetic resonance imaging ("MRI") system;

at least one processor configured to:
    receive from the input a plurality of low resolution diffusion images each acquired with a different set of gradient directions and shifted in a slice direction;
    generate a model correlating diffusion signals associated with the plurality of low resolution diffusion images and a high resolution diffusion image;
    reconstruct the high resolution diffusion image by minimizing a cost function determined using the model;
    process the high resolution diffusion image to generate a report providing diffusion information associated with the subject;
an output for displaying the report.

14. The system of claim 13, wherein the plurality of low resolution diffusion images are sampled over a spherical shell in q-space.

15. The system of claim 13, wherein the plurality of low resolution diffusion images comprise anisotropic voxel sizes.

16. The system of claim 13, wherein the plurality of low resolution diffusion images overlap in the slice direction.

17. The system of claim 13, wherein in the model, voxels associated with the high resolution diffusion image are represented in a sparsifying basis.

18. The system of claim 17, wherein the sparsifying basis comprises spherical ridgelets.

19. The system of claim 13, wherein the processor is further configured to perform an alternating direction method of multipliers to reconstruct the high resolution diffusion image.

20. The system of claim 13, wherein the processor is further configured to utilize anatomical information in reconstructing the high resolution diffusion image.

21. The system of claim 13, wherein the processor is further configured to a tractography using the reconstructed high resolution diffusion image.

22. The system of claim 13, wherein the processor is further configured to apply a total variation regularization to account for diffusion signal correlations between neighboring voxels in the high resolution diffusion image.

23. The system of claim 13, wherein the processor is further configured to analyze the high resolution diffusion image to estimate at least one of a blood flow or a blood volume, or both.

24. The system of claim 13, wherein the report includes a representation of at least one of a brain connectivity, or a brain structure, or both.

25. The system of claim 13, wherein the report includes perfusion information associated with the subject.

* * * * *

UNITED STATES PATENT AND TRADEMARK OFFICE
CERTIFICATE OF CORRECTION

PATENT NO. : 10,302,727 B2
APPLICATION NO. : 14/940202
DATED : May 28, 2019
INVENTOR(S) : Yogesh Rathi et al.

Page 1 of 1

It is certified that error appears in the above-identified patent and that said Letters Patent is hereby corrected as shown below:

In the Specification

Column 11, Line 74, Eq. (7), " $\Psi_{SR} = \{\phi_{j,v_j^i} \mid k = -1, 0, 1, \ldots, J, \mid i-1, 2, \ldots, M_j\}$ " should be -- $\Psi_{SR} = \{\phi_{j,v_j^i} \mid j = -1, 0, 1, \ldots, J, \mid i-1, 2, \ldots, M_j\}$ --.

Column 12, Line 26, "l$_2$" should be --$\ell_2$--.

Column 12, Line 57, "l$_1$" should be --$\ell_1$--.

Column 12, Line 66, "l$_1$" should be --$\ell_1$--.

Column 13, Line 5, "l$_1$" should be --$\ell_1$--.

Column 13, Line 11, "l$_1$" should be --$\ell_1$--.

Column 13, Line 39, " $N = \Sigma_{k=1}^{K} N_k$ " should be -- $N = \Sigma_{k=1}^{K} N_k$ --.

Column 16, Line 55, "Error" should be --2) Error--.

Column 16, Line 55, "connectivity tractography" should be --connectivity using tractography--.

Column 16, Line 64, "coordinate of the tracts as utilized" should be --coordinates of the tracts was utilized--.

Signed and Sealed this
Sixteenth Day of July, 2019

Andrei Iancu
*Director of the United States Patent and Trademark Office*